United States Patent [19]

Barajas

[11] Patent Number: 4,657,589
[45] Date of Patent: Apr. 14, 1987

[54] SOLDER CREAM

[75] Inventor: Felix Barajas, Huntington Beach, Calif.

[73] Assignee: McDonnell Douglas Corporation, Long Beach, Calif.

[21] Appl. No.: 825,155

[22] Filed: Feb. 3, 1986

[51] Int. Cl.$^4$ .................. C09D 5/00; B23K 35/34
[52] U.S. Cl. .................. 106/1.13; 106/1.14; 106/1.18; 106/1.19; 148/24; 148/25
[58] Field of Search .................. 106/1.13, 1.14, 1.18, 106/1.19; 148/24, 25

[56] References Cited

U.S. PATENT DOCUMENTS

| | | | |
|---|---|---|---|
| 3,915,729 | 10/1975 | Eustice | 106/268 |
| 4,373,974 | 2/1983 | Barajas | 148/24 |
| 4,509,994 | 4/1985 | Barajas | 148/24 |
| 4,531,986 | 7/1985 | Barajas | 148/24 |

Primary Examiner—Lorenzo B. Hayes
Attorney, Agent, or Firm—Max Geldin

[57] ABSTRACT

A solder composition containing a small amount of gold added to the solder metal, to avoid cracking of solder joints in electronic circuits, particularly densely packed microelectronic circuits, during thermal cycling. The solder composition comprises 85 to 90% of total solder metal and 10 to 15% of a vehicle for the solder metal, the solder metal containing about 0.2 to about 3% of particulate gold, by weight of the solder metal.

20 Claims, 2 Drawing Figures

SOLDER CREAM

BACKGROUND OF THE INVENTION

This invention relates to novel solder compositions or solder creams, and is particularly concerned with the provision of solder compositions especially adapted for soldering components in densely packed microelectronic circuits and wherein the solder joints do not crack during thermal cycling of the system, e.g. computers, containing such circuits.

A solder cream is a material that is capable of being applied to a substrate or surface in a specific pattern using screening or analogous methods which can subsequently undergo fusing to provide an electrical joint or interface commonly described as a solder joint. The solder cream generally consists of metallic particles of various alloys such as tin-lead, tin-lead-silver, etc., contained in a vehicle including a flux such as wood rosin, or derivatives thereof.

Currently, microelectronic circuits are made by surface mounting chip carriers and other components on ceramic and plastic substrates by vapor phase soldering. Circuits similar to those used on printed circuit boards are produced on the substrates. In certain instances, the circuit is located on one side of the substrate, with pads being provided in certain areas, other parts of the circuit being covered with an insulating material.

The solder cream having a paste-like consistency is applied, for example by means of a silk screen, to the pads on the circuit board. Thereafter, the electronic components are carefully positioned with their peripheral contacts on the solder cream-coated pads. When all of the components are thus in place, the board, with such components temporarily positioned and retained thereon by the solder cream, can be placed in a vapor reflow system and subjected to a sufficiently high temperature to cause the metal content of the solder cream to liquefy and the contacts of the electronic components to be fused and to adhere to the pads on the circuit board. Examples of solder compositions are described in U.S. Pat. No. 3,684,533 to Conwicke and U.S. Pat. Nos. 4,373,974, 4,509,994 and 4,531,986, to Barajas.

However, densely packed microelectronic circuits often fail prematurely because the solder joints employed therein crack during the thermal cycling associated with normal operation of modern fast computers containing such circuits.

It is accordingly an object of the present invention to provide an improved solder composition or solder cream which is especially adapted for soldering components in electronic circuitry, particularly densely packed microelectronic circuits.

Another object is the provision of a solder composition of the above type employing solder alloys which avoids cracking of solder joints in microelectronic circuits, particularly those employed in modern fast computers, as a result of thermal cycling associated with normal operation thereof.

SUMMARY OF THE INVENTION

The above objects and advantages are achieved according to the invention, by the addition of a small amount of gold, e.g. about 2% by weight, to the solder metal or alloy employed in the solder cream, which can be of a type disclosed in any of the above Barajas patents. This results in an unique solder alloy, minimizing cracking of solder joints in electronic circuits, particularly cularly densely packed microelectronic circuits, and premature failing thereof, during the thermal cycling associated with normal operation of modern fast computers.

Thus, the improved solder composition of the invention comprises a major portion of finely divided solder metal and a minor portion of a vehicle for the solder metal, and wherein the solder metal contains a small amount of particulate gold within a narrow range, i.e. 0.2 to about 3%, by weight of the solder metal.

The use of gold as a solder metal is disclosed in the above Conwicke patent and the above Barajas U.S. Pat. No. 4,373,974. Gold-bearing solder creams have been used to prevent gold leaching during soldering gold coated microelectronic components. However, the use of gold in a small critical amount within the above noted narrow range to form a solder alloy having the advantages noted above, is believed novel and unexpected. The resulting gold-bearing alloy of the invention has the additional advantage of possessing an improved, that is lower, electrical conductivity as compared to presently employed solder alloys.

DETAILED DESCRIPTION OF THE INVENTION AND PREFERRED EMBODIMENTS

Figure 1:
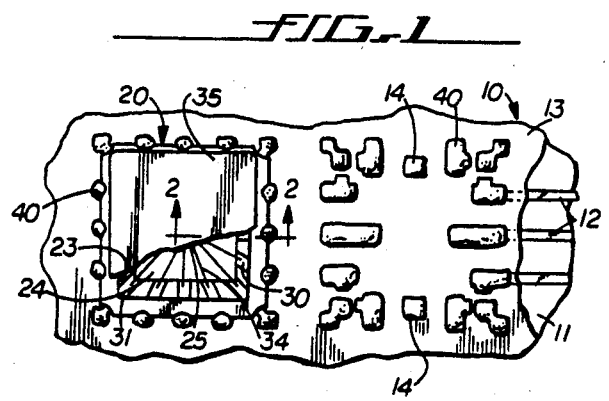
Figure 2:
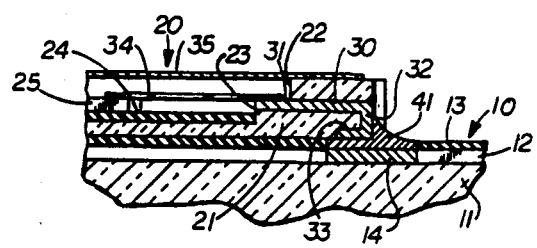

The invention will be more clearly understood by reference to the description below, taken in connection with the accompanying drawings wherein:

FIG. 1 is an enlarged, fragmentary plan view of a portion of a circuit board of a densely packed microelectronic circuit, with a component mounted thereon and connected to a pad of small area size by means of the solder cream of the present invention; and FIG. 2 is a further enlarged, fragmentary, sectional view through the component and the circuit board, and taken substantially along the line 2—2 of FIG. 1:

With reference to the drawings, there is illustrated a circuit board 10 which comprises a substrate 11 which may be of any nonelectrically conductive material such as ceramic, plastic or the like. In the manner familiar to this art, a circuit 12 is printed or otherwise deposited upon the substrate 11. Thereafter, a coating 13, which may be lacquer or the like, is deposited on the major portion of the circuit 12, leaving exposed areas or pads 14. The circuit 12 may be formed from any suitable metallic material such as gold, platinum, copper, or the like, which has an affinity for solder.

Chip carriers, indicated generally at 20, (or other electrical components) are intended for electrical attachment to the exposed pads 14 on the circuit board through use of the solder cream of this invention. The pads 14 are of square configuration. The chip carriers 20 are generally made from a nonconducting material, such as ceramic, and, in the present instance, are illustrated as being generally square. Each chip carrier includes a body 21 which has stepped openings 22 and 23 therein. An insulating material 24 is deposited within the opening 23 and retained therein by any suitable cement.

The chip carriers are also provided with contacts 30 of a conducting material such as gold or the like. The contacts 30 are embedded in the carrier body 21 and have portions extending into the recess 22 as at 31. The contacts 30 extend to the outer edge of the body 21, over that edge as at 32, and inwardly as at 33 to expose contact portions that are configured generally to correspond with the pattern of the pads 14 on the circuit board 10. The inner ends 31 of the contacts 30 are connected to the chip 25 by means of small wires 34. Each of the ends of the wires 34 have their connections secured as by welding. The wires 34 must be secured utilizing special welding machinery under microscopic viewing. A cover 35 is generally secured to the body 21 to protect the wires 34 and the chip 25.

The solder crea of the present invention is used by first applying it to each of the pads 14. This may be accomplished by means of a syringe-type dispenser or preferably by screening the solder cream onto the pads 14.

Following application of the solder cream to the pads 14, the chip carriers 20 are carefully positioned whereby the portions 33 of the contacts 30 are immersed in the solder cream shown at 40 in FIG. 1. The chip carriers are thus temporarily retained in position by means of the solder cream, its viscosity being such as to form a soft attachment.

Thereafter, the circuit board containing the temporarily positioned chip carriers is placed in a vapor reflow system and heated by means of the vapor therein, to a temperature sufficient to flow the metal component of the solder cream. Upon removal of the board from the vapor reflow system, the board is subjected to a vapor bath of a suitable solvent which cleans the board and removes residual flux and its vehicle therefrom. The final solder connection is as illustrated at 41 in FIG. 2 which, through the wires 34 and contacts 30, electrically connect selected areas of the chip 25 to each individual pad 14.

The solder composition or solder cream of the invention permits the formation of strong efficient solder connections as at 41 between the small square pad 14 and the electrical contacts 30 to the chip 25 and which avoid cracking during thermal cycling of the circuit.

The vehicle for the solder metals of the solder composition of the invention is a liquid composition having desirable viscosity characteristics and which maintains the solder metals in suspension without settling of the fine solder particles. Such vehicle can include viscosity controlling agents, organic solvents, rosin, or derivatives thereof, as flux, and other components such as organic amines.

Thus, one component of the vehicle is a compound which increases the viscosity of the vehicle to the desired consistency, such as a thixotropic agent, and which can also function as a suspension medium to prevent settling of the solder particles. The amount of thixotropic agent is within the range 0.5–10% by weight of the vehicle. Any thixotropic agent can be used, provided that it does not leave a residue insoluble in organic solvents (e.g. trichloroethylene) on the solder metal, after the firing operation. Common thixotropic agents are disclosed by Erich, "Theology," Academic Press, New York, 1967, Vol. 4, page 457. A preferred thixotropic agent is hydrogenated castor oil (Baker Castor Oil Co. "Thixatrol"). Carboxy methyl cellulose also can be used.

A second component of the vehicle is an organic solvent which provides the proper consistency for the vehicle. Such organic solvent is present in the range of 30 to 60%, by weight of the vehicle. Any of the common organic solvents, preferably non-chlorinated, may be used for this purpose, such as ketones, e.g. acetone, methyl ethyl ketone, methyl isobutyl ketone, and the like, esters such as alkyl acetates, mineral spirits, the terpenes (e.g. betaterpineol), ethylene glycol, glycerol, aromatic hydrocarbons such as benzene, toluene, xylene, and phenol, and mixtures thereof. Preferably a solvent such as 2-butoxy (ethyl) ethyl acetate, 2-butoxy ethyl acetate, ethylene glycol or beta-terpineol is used.

If desired, the solvent can be in the form of a low volatile alcohol, preferably a high molecular weight primary aliphatic monoalcohol containing from about 8 to about 18 carbon atoms, particularly about 12 to about 18 carbon atoms. These are high boiling alcohols, including saturated and unsaturated alcohols, preferably the former, in either liquid or solid form. Examples of such alcohols are the saturated octyl, decyl, lauryl, myristyl and stearyl alcohols. Examples of unsaturated alcohols are oleyl, linoleyl and linolenyl alcohols. The preferred alcohol is cetyl alcohol. The use of such low volatile alcohols as solvent in the vehicle is disclosed in above Barajas U.S. Pat. No. 4,531,986.

Another component of the vehicle is a flux. Various types of fluxes can be employed. Thus, one suitable flux is a rosin type flux, that is, rosin or derivatives thereof. Rosin, the non-steam volatile fraction of pine oleo-resin, is a mixture of five isomeric diterpene acids, the most abundant component being abietic acid. The terminology "rosin and derivatives thereof" includes rosin derived from gum, wood or tall oil, the acids in rosin such as abietic acid, and any of their derivatives, such as "Staybelite," "Poly-Pale," "Dimerex," "Vinsol," etc. The amount of flux present in the vehicle can range from 2–65%, preferably 30–60%, by weight of the vehicle.

Other organic materials can be employed as flux, such as petrolatum, rosin mixed with waxy or fatty material, paraffin waxes and long chain organic acids such as adipic acid, and tars.

Also, the flux can be a warer-soluble material such as an aqueous solution of sorbitol.

The flux also can comprise inorganic materials such as, for example, borax, alkali metal fluoborates, and the like.

Other components such as amine hydrochlorides, e.g. propylamine hydrochloride, hydroxyl substituted aliphatic amines, and aliphatic amines such as isopropyl amine, can be present. These materials can be present in amounts ranging from 0.01 to 10% by weight of the vehicle.

Alternatively, in place of the above described vehicle there can be employed a fluorinated tertiary alkylamine as vehicle for the solder composition of the invention. Such vehicle is a compound which is semi-solid at room temperature and which confers a creamy consistency on the solder composition at room temperature. A particularly advantageous amine for this purpose is a perfluorotrihexyl amine.

The fluorinated tertiary alkyla,ine is preferably a perfluoronated trialkyl amine containing from 4 to 8 carbon atoms. Most desirably, the material employed is perfluorotrihexyl amine, marketed as FC71 by 3M Co. This material is understood to comprise the straight chain and branched chain isomers, and also mixtures thereof. This material has a boiling range of about 250° to about 255° C., e.g. about 253° C. While being semi-solid at about room temperature, the FC71 commences to turn liquid at slightly elevated temperature of about 25° to about 30° C.

There can be added optionally to the above fluorinated tertiary alkylamine vehicle a small amount of an organic bromated activator compound, which functions to react with and reduce any lead oxide and tin oxide in the solder metal powder during vapor phase soldering and convert such oxides to the corresponding bromides, which can be washed away from the solder joint to prevent contamination thereof. Thus, an organic bromide such as bromocyclohexane or bromocamphor can be employed for this purpose. The amount of such material employed can range, for example, from about 0.1 to about 1% by weight of the total or overall solder composition. A solvent such as isopropyl alcohol can also be added to disperse the activator in the solder composition. Such solvent can also aid to achieve the desired viscosity for the solder composition, for example a viscosity of the order of about 500,000 centipoises at 20° C. The amount of such solvent employed can range from about 2 to about 15 parts, e g. 10 parts, per part of activator, by weight.

The above described vehicle containing a fluorinated tertiary alkylamine as the essential component is disclosed in U.S. application Ser. No. 821,231, filed Jan. 22, 1986, titled "Rosin-Free Solder Composition" by F. Barajas and D. W. Bridges, and assigned to the same assignee as the present application, and is incorporated herein by reference. When employing a solder composition according to the invention containing such fluorinated tertiary alkylamine vehicle, no organic residues are formed following soldering and no elaborate cleaning procedure is thus required to remove any char residues from circuit boards after soldering.

The solder compositions of the invention contain finely divided solder metals, in the form of metallic balls or particles, dispersed in the vehicle. The solder metals can be any of the conventional single or multiphase metals normally used for soldering, particularly tin, lead and silver, and alloys and mixtures thereof. Alloys or mixtures of tin-lead, tin-lead-silver, tin-silver, lead-silver, and lead-tin, for example, can be employed. A preferred mixture of solder metals employed in the solder composition of the invention consists essentially of a mixture of lead, tin and silver, which can contain from 61.5 to 62.5% tin, 1.75 to 2.25% silver, and the balance lead. A particularly preferred solder metal mixture consists of 36% lead, 62% tin and 2% silver. Another preferred solder metal consists of 63% lead and 37% tin.

According to the invention, there is added to the solder metal or solder alloy, about 0.2 to about 3%, preferably about 0.5 to about 2.5% of gold, by weight of the solder metal. This can be accomplished by first melting the solder alloy, then adding the above noted small amount of gold to the molten solder alloy, and atomizing (blowing) the resulting alloy to form a suitable powder.

The resulting mixture of solder metal and gold particles, should be finely divided, preferably having a particle size ranging from about 0.5 to about 100 microns, e.g. about 0.5 to about 70 microns, in diameter.

It has been found that the use of the above noted small and narrow range of gold in the solder alloy is important and critical to obtain the invention results, namely the production of a solder alloy which avoids cracking of solder joints during thermal cycling. The use of an amount of gold above 3% by weight of the solder metal raises the melting temperature of the solder alloy to an undesirably high level, making it difficult to melt the solder particularly during vapor phase soldering, and also can result in undesirable gold embrittlement.

The solder compositions of the invention are prepared by admixing the solder metal including particulate gold, of the desired particle size, and the vehicle in certain proportions, as noted below. In preferred practice, there is employed 85 to 90% of the mixture of solder metal or alloy, and particulate gold, and 10 to 15% of vehicle, by weight, most desirably 86 to 88% of such mixture of solder metal and gold, and 12 to 14% of vehicle, by weight.

The solder compositions of the invention can be employed for soldering components such as capacitors, resistors, integrated circuits and their packages or carriers, transistors, diodes, etc., onto a circuit, carried on a substrate. The solder compositions hereof are particularly applicable for use as microelectronic-grade solder creams, especially in the provision of densely packed microelectronic circuits.

The solder composition of the invention can be applied to any suitable substrate such as small metal pads on a circuit board to which contacts of electronic components are to be soldered. Such application of the solder composition or solder cream can be made by use of metal screening to apply the solder cream to the pads. However, other modes of applying the solder cream in addition to screen printing, can be employed, including, for example, dipping the objects to be soldered into the solder composition, or employing syringe techniques.

Thereafter, the solder is heated to a temperature at which the solder becomes molten and a highly adherent fused solder bond is formed. For this purpose, vapor phase soldering is a preferred method, although other methods of heating the solder such as the use of belt furnaces, and infra-red heating can be employed. Any atmosphere for heating can be used, e.g., air, or an inert atmosphere employing an inert gas such as nitrogen.

The following table shows examples of soldering compositions according to the invention.

TABLE

| COMPOSITIONS | A | B | C | D | E | F | G |
| --- | --- | --- | --- | --- | --- | --- | --- |
| Vehicle (weight %) | 13.5 | 13 | 12 | 14 | 12.5 | — | — |
| Abietic acid | 59 | 59 | — | 50 | 35 | — | — |
| Paraffin wax | — | — | 69 | — | — | — | — |
| 2-butoxy (ethyl) ethyl acetate | 31 | 31 | — | 40 | 55 | — | — |
| Cetyl alcohol | — | — | 15 | — | — | — | — |
| Hydrogenated castor oil | 8 | 8 | 14 | 7 | 7 | — | — |
| Isopropyl amine | 2 | 2 | 2 | 3 | 3 | — | — |
| FC71 vehicle | — | — | — | — | — | 14 | 13 |
| Solder metal + gold particles | 86.5 | 87 | 88 | 86 | 87.5 | 86 | 87 |
| Solder metal (40–70 micron size) (wt. %) | | | | | | | |
| Lead | 36 | 63 | 36 | 63 | 63 | 36 | 63 |
| Tin | 62 | 37 | 62 | 37 | 37 | 62 | 37 |
| Silver | 2 | — | 2 | — | — | 2 | — |
| Gold particles (40–70 micron size) (% by wt. of solder metal) | 2 | 1.5 | 1.0 | 2.25 | 1.0 | 2 | 2.5 |
| Bromocyclohexane (wt. % of total composition) | — | — | — | — | — | — | 0.5 |
| Isopropyl alcohol (wt. % of total composition) | — | — | — | — | — | — | 5 |

The following are examples of practice of the invention.

EXAMPLE I

In producing solder composition or solder cream A of the above Table, a lead-tin-silver metallic mixture or solder metal in the proportions of 36% lead, 62% tin and 2% silver, designated SN62, is melted in an inert atmosphere of nitrogen to prevent formation of oxides. There is then added to the molten metal mixture or alloy, gold particles in an amount of 2% by weight of the initial lead-tin-silver mixture (2 parts of gold per 100 parts of molten solder metal mixture, by weight).

The resulting molten metal or alloy containing gold particles is then atomized to form a metallic powder. Such metallic powder is blown into a chamber, the metal balls are screened so that the particle size thereof is between 40 and 70 microns, and the particles are then mixed with the vehicle under conditions to form a homogeneous cream composition, such operations being carried out in an inert atmosphere, e.g. of nitrogen, to eliminate oxidation of the metals. In this example, the vehicle and metal mixture are combined in a percentage of 13.5% of the vehicle and 86.5% of the metallic mixture of solder metal and gold, by weight.

The solder cream is used to secure miniature electronic components to a ceramic substrate. A printed densely packed microelectronic circuit is produced on the substrate. The circuit is on one side of the substrate, with pads composed of platinum and gold being provided in certain areas, other parts of the circuit being covered with an insulating material.

A screen is placed over the circuit and the pads, and the above solder cream is screened onto the pads on the circuit board. Thereafter, electronic components including capacitors and resistors are carefully positioned with their peripheral contacts on the solder cream-coated pads.

When all of the components are thus in place, the board, with such components temporarily positioned and retained thereon by the solder cream, is placed in a vapor phase soldering system and subjected to a temperature of 215° C. Since the solder metal mixture or alloy employed has a melting range between about 177° C. and about 189° C., the system temperature melts the metallic particles of the solder metal and also liquefies the vehicle and fuses or adheres the contacts of the components, to the pads on the circuit board by means of solder alloy joints containing a small amount of gold, and leaving the components securely positioned in place and soldered to the pads on the board.

Following the soldering operation, the resulting densely packed microelectronic circuit is subjected to thermal cycling over an extended period of operation, without cracking of the solder joints during such thermal cycling.

EXAMPLE II

The procedure of Example I is followed employing respectively, solder compositions B through G of the above Table.

Substantially the same results are obtained, namely effective soldering of the electronic components, with substantially no cracking of the gold-containing solder joints occurring during operation and thermal cycling of the circuit.

From the foregoing, it is seen that the invention provides a novel solder composition containing a small amount of particulate gold in the solder metal powder, which results in the production of solder joints following soldering, such as vapor phase soldering, with essentially no cracking of such solder joints particularly when employed for soldering components in densely packed microelectronic circuits. The small amount of gold can be readily incorporated into the solder alloy and the resulting alloy formed into a fine powder which can be readily mixed with any suitable vehicle as described above, to produce the improved solder composition of the invention.

While particular embodiments of the invention have been described for purposes of illustration, it will be understood that various changes and modifications within the spirit of the invention can be made, and the invention is not to be taken as limited except by the scope of the appended claims.

What is claimed is:

1. In a solder composition especially adapted for soldering components in electronic circuits to form solder joints substantially free from cracking, which comprises a major portion of finely divided solder metal and a minor portion of a vehicle, for said solder metal the improvement comprising about 0.2 to about 3% of particulate gold, by weight of the solder metal.

2. The solder composition of claim 1, said solder metal being selected from the group consisting of tin, lead and silver, and alloys and mixtures thereof.

3. The solder composition of claim 1, containing 85 to 90% of total solder metal including gold, and 10 to 15% of said vehicle, by weight.

4. The solder composition of claim 1, said particulate gold ranging from 0.5 to about 2.5% by weight of said solder metal.

5. The solder composition of claim 3, said particulate gold ranging from 0.5 to about 2.5% by weight of said solder metal.

6. The solder composition of claim 1, wherein said vehicle contains a viscosity controlling agent and a flux.

7. The solder composition of claim 3, the particle size of said solder metal and particulate gold ranging from about 0.5 to about 100 microns.

8. The solder composition of claim 6, wherein said viscosity controlling agent is a thixotropic agent and the flux is a rosin type flux or a parafin wax.

9. The solder composition of claim 8, wherein said vehicle also contains an organic solvent.

10. The solder composition of claim 9, wherein said vehicle consists of 0.5–10% of said thixotropic agent, 30–60% of said organic solvent and 20–65% of said flux, by weight.

11. The solder composition of claim 10, wherein said vehicle contains 0.5–10% hydrogenated castor oil, 30–60% 2-butoxy (ethyl) ethyl acetate and 20–65% of a rosin type flux comprising abietic acid.

12. In a solder composition especially adapted for soldering components in electronic circuits to form solder joints substantially free from cracking, which comprises finely divided solder metal and a vehicle containing 0.5–10% of a viscosity controlling agent, 30–60% of an organic solvent, and 20–65% of a flux selected from the group consisting of a rosin type flux and a paraffin wax, by weight, gold, said composition containing 85–90% of said solder metal and 10 to 15% of said vehicle, said solder metal having a particle size ranging from about 0.5 to about 100 microns; the improvement comprising about 0.5 to about 2.5% of gold, by weight of solder metal.

13. The solder composition of claim 1, wherein said vehicle is a fluorinated tertiary alkylamine which is semi-solid at room temperature and which confers a creamy consistency on the composition at room temperature.

14. The solder composition of claim 13, said fluorinated tertiary alkylamine being a perfluorinated trialkyl amine containing from 4 to 8 carbon atoms.

15. The solder composition of claim 14, said perfluorinated trialkyl amine being a perfluorotrihexyl amine.

16. The solder composition of claim 13, containing 85 to 90% of solder metal and 10 to 15% of said fluorinated tertiary alkylamine, by weight, said solder metal containing about 0.5 to about 2.5% gold by weight of the solder metal.

17. The solder composition of claim 16, the particle size of said solder metal and gold ranging from about 0.5 to about 100 microns.

18. The solder composition of claim 17, including a small amount of an organic brominated activator compound which reacts at soldering temperature with any lead oxide or tin oxide present in the solder metal, to convert said oxides to the corresponding bromides, and a small amount of a solvent to disperse said activator in the solder composition.

19. The solder composition of claim 1, said solder metal being a mixture of lead, tin and silver.

20. The solder composition of claim 1, said solder metal being a mixture of lead and tin.

* * * * *